United States Patent [19]

Kamiyama et al.

[11] Patent Number: 5,422,163
[45] Date of Patent: Jun. 6, 1995

[54] FLEXIBLE SUBSTRATE WITH PROJECTIONS TO BLOCK RESIN FLOW

[75] Inventors: Tadashi Kamiyama; Yoshiaki Emoto, both of Tokyo, Japan

[73] Assignee: Nippon Steel Corporation, Tokyo, Japan

[21] Appl. No.: 164,787

[22] Filed: Dec. 10, 1993

Related U.S. Application Data

[63] Continuation of Ser. No. 833,728, Feb. 12, 1992, abandoned.

[30] Foreign Application Priority Data

Feb. 13, 1991 [JP]  Japan ................... 3-042594

[51] Int. Cl.⁶ ............................................. H01L 21/56
[52] U.S. Cl. ..................................... 428/156; 428/131;
428/137; 428/157; 428/172; 428/473.5;
428/458; 428/195; 428/209; 428/99; 428/906;
206/330; 206/331; 437/207; 437/219; 257/666;
257/667
[58] Field of Search ................ 428/131, 137, 156, 157,
428/172, 473.5, 458, 195, 209, 99, 906; 206/330,
331; 437/207, 219; 257/666, 667

[56] References Cited

U.S. PATENT DOCUMENTS

| | | | |
|---|---|---|---|
| 3,689,991 | 9/1972 | Aird | 29/577 |
| 4,763,407 | 8/1987 | Abe | 357/70 |
| 5,031,022 | 7/1990 | Yamamoto et al. | 357/70 |
| 5,064,706 | 11/1991 | Ueda et al. | 428/131 |
| 5,137,479 | 8/1992 | Ohikata et al. | 357/70 |
| 5,177,591 | 1/1993 | Emanuel | 257/666 |

FOREIGN PATENT DOCUMENTS

| | | | |
|---|---|---|---|
| 0124075 | 10/1978 | Japan | 437/207 |
| 0110048 | 6/1983 | Japan | 437/207 |
| 0035550 | 2/1985 | Japan | 257/667 |
| 60-41247 | 3/1985 | Japan | 437/207 |
| 1183837 | 7/1989 | Japan | |
| 2278845 | 11/1990 | Japan | 257/666 |
| 2310955 | 12/1990 | Japan | 257/667 |
| 8900337 | 1/1989 | WIPO | 437/207 |

Primary Examiner—William P. Watkins, III
Attorney, Agent, or Firm—Pollock, Vande Sande & Priddy

[57]   ABSTRACT

A flexible substrate to be used for assemblage of a semiconductor chip having connecting points to be electrically connected to an external side, comprises a base film unit made of a flexible synthetic resin and including a mounting portion for mounting thereon a semiconductor chip, groups of conductive leads formed on a surface of the base film unit, each lead group including a plurality of the leads formed so as to extend from respective positions in the mounting portion corresponding to the connecting points of the semiconductor chip as mounted in the mounting portion to selected positions on the base film unit, and a plurality of projections each formed at an area between adjacent two of the lead groups on the surface of the base film unit and having a height substantially equal to the height of the leads of the lead group.

23 Claims, 6 Drawing Sheets

FLEXIBLE SUBSTRATE WITH PROJECTIONS TO BLOCK RESIN FLOW

This application is a continuation of Ser. No. 07/833,728, filed on Feb. 12, 1992 now abandoned.

BACKGROUND OF THE INVENTION

1. Field of the Invention

The present invention relates to a flexible substrate, such as a TAB tape, to be used for assemblage of a semiconductor chip such as for example, a microprocessor and a metallic mold to be used for resin-molding a semiconductor chip mounted to the flexible substrate.

2. Description of the Related Art

A TAB (Tape Automated Bonding) technique is one of the mounting techniques of an IC chip. This TAB technique has an advantage, for example, in that it permits to form leads with more multiple pins and narrower pitch, as compared with other mounting techniques, and the high speed automatic bonding can be performed in the face-up mode. Therefore, the TAB technique has recently attracted special attention.

Figure 11:
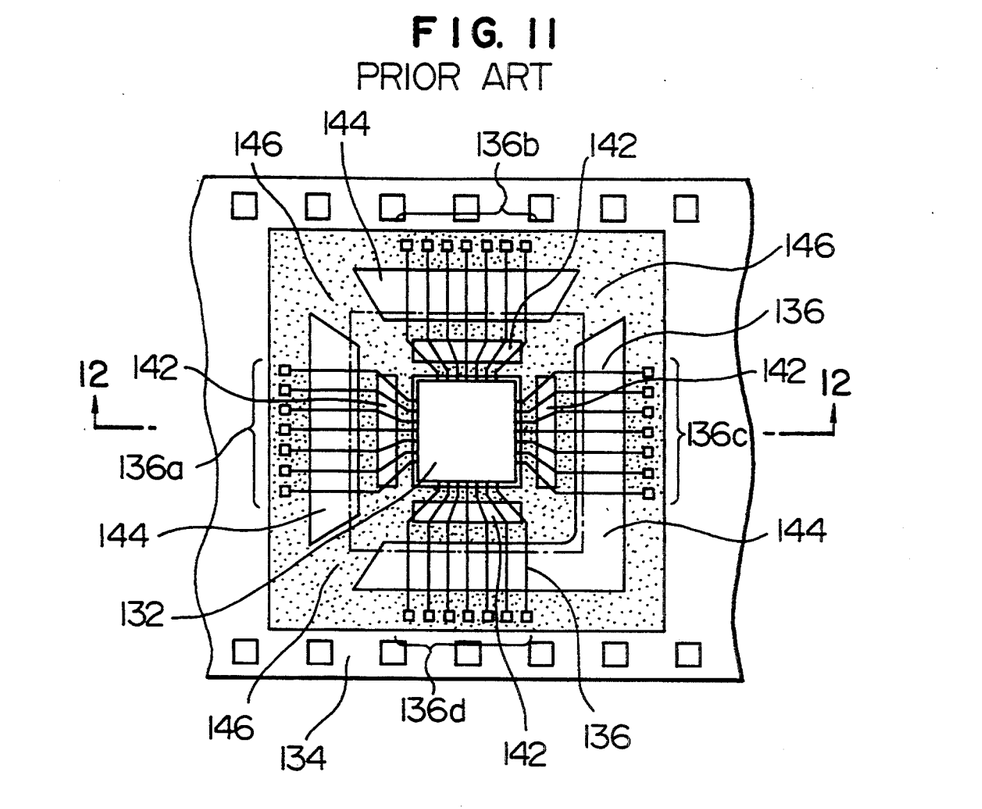
FIG. 11 is a schematic plan view showing the construction of the prior art TAB tape.
Figure 12:
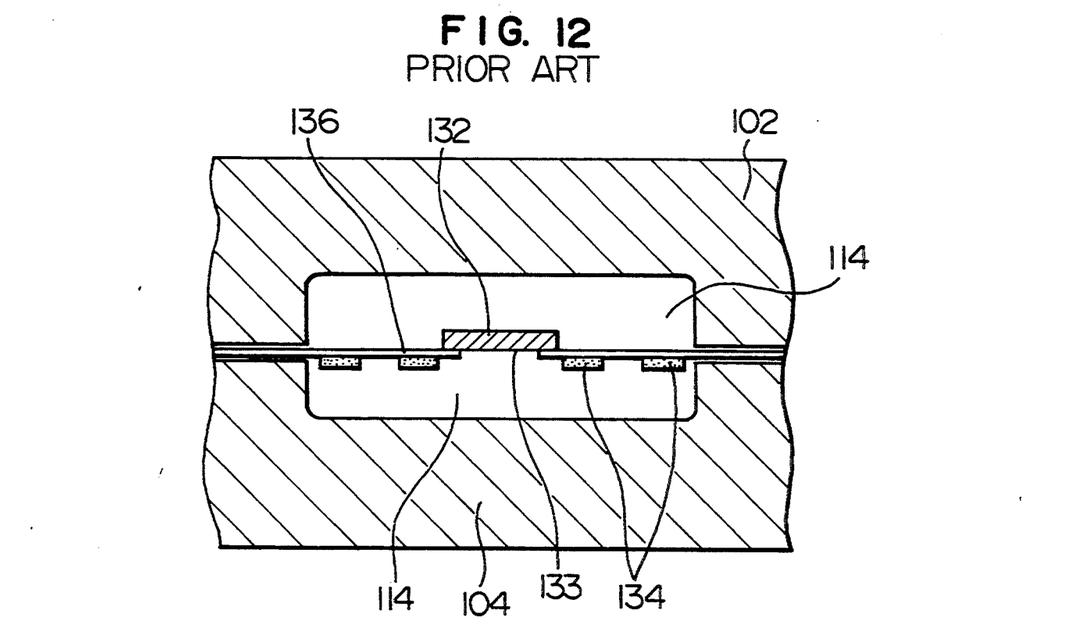
FIG. 12 is a schematic sectional view showing a state in which the prior art TAB tape is held in the metallic mold for resin molding.

FIG. 11 is a schematic plan view showing the construction of a typical TAB tape which is generally used. FIG. 12 is a schematic sectional view, viewed from the line D—D of FIG. 11, showing a state in which the TAB tape shown in FIG. 11 is held in a metallic mold for resin molding.

The TAB tape shown in FIG. 11 includes an IC chip 132, and a film carrier in which leads 136 are formed on a film 134. The IC chip 132 is bonded to the leads 136 through respective bumps (not shown). In the film 134, there are formed a device hole 133 to which the IC chip 132 is mounted, and two kinds of punch holes 142 and 144. The groups of leads 136a through 136d are, as shown in FIG. 11, extracted in four directions, that is, upward, downward, right-ward and left-ward. Moreover, a portion surrounded by a dashed line in FIG. 11 is an area to be resin-molded, and the portions of the tape to be resin-molded are supported by supporting portions 146.

Then, in order to resin-mold the IC chip 134 for protection of the IC chip 132, the transfer mold method is mainly used. The transfer mold method is a method wherein, as shown in FIG. 12, the TAB tape having the IC chip 132 mounted thereon is held in a metallic mold for resin-molding including an upper metallic mold 102 and a lower metallic mold 104 and a resin melted by heat is injected under pressure into a resin injection cavity 114 defined between the upper and lower metallic molds 102 and 104 and solidified. This method is advantageous in that if the injection of the melted resin into the metallic mold for resin molding is performed at a low rate, it is possible to massproduce resin-molded ICs having constant quality without deteriorating the characteristics of the IC chips and the like.

However, when the leads formed on the flexible tape, such as the TAB tape, are gripped by the metallic mold for resin molding, gaps are produced between the adjacent leads since each lead has a thickness. Generally, the resin can flow into a gap having a width of 50 μm. Accordingly, when the melted resin is injected into the cavity in the metallic mold for resin molding, the resin flows into gaps between the adjacent leads so that burrs are produced between the adjacent leads much or less depending on the thickness of the leads. Therefore, there arises a problem in that when the resin-molded TAB tape is punched, the leads are deformed or cut due to the presence of the burrs. On the other hand, in a method described in JP-A-1-183837 (1989), the TAB tape is pressed at its upper and lower sides by the metallic mold for package to forcedly deform the tape by the pressure, whereby the gaps between the leads and the tape are closed to prevent the leakage of the resin. Generally, the leakage of the resin is prevented. However, there is a possibility that due to the pressing pressure of the metallic mold required for closing the gaps between the leads and the tape, the leads are deformed which degrades the conductivity.

Moreover, as described in U.S. Pat. No. 3,689,991 and U.S. Pat. No. 5,031,022, there is known a method in which the shape of the lead is so designed that the leakage of the resin is prevented. In such a case, however there arises a problem in that since the gaps are produced at portions where no lead is extracted (the same as the supporting portions 16 of FIG. 11), between the upper metallic mold and the film correspondingly to the thickness of the lead, the leakage of the resin may occur at those portions to produce burrs.

The present invention has been made on the basis of the above circumstance and it is an object of the invention to provide a flexible substrate to be used for assemblage of a semiconductor chip and capable of preventing burrs from being produced when performing the resin molding and to provide a metallic mold to be used for resin-molding the semiconductor chip mounted to the flexible substrate.

SUMMARY OF THE INVENTION

In order to attain the above object, a flexible substrate to be used for assemblage of a semiconductor chip according to the present invention comprises: a substrate made of flexible synthetic resin and including a mounting portion for mounting thereon a semiconductor chip; groups of conductive leads formed on a surface of the substrate, each lead group including a plurality of the leads formed so as to extend from respective positions in the mounting portion for mounting a semiconductor chip and confronting with those points of the semiconductor chip to be electrically connected to an external side to predetermined positions on the flexible substrate; and projections formed at areas on a surface of the substrate and having no lead group formed thereon, so as to have a thickness approximately equal to that of the lead of the lead groups. The flexible substrate is made of polyimide. Each lead of the lead groups is made of gold. Moreover, the flexible substrate further comprises resin leakage preventing means for preventing resin leakage when resin-molding the semiconductor chip at predetermined positions of the lead groups. The resin leakage preventing means is made of polyimide. The lead groups extend in four directions from the mounting portion, on the surface of the substrate, for mounting thereon the semiconductor chip. The projections are formed in three of those portions where the four lead groups made up of the groups of leads and the substrate are not extracted. The plurality of substrates are arranged consecutively with predetermined intervals forming a tape. Further, the tape-shaped substrate further comprises sprocket holes on the both sides thereof.

Moreover, in order to attain the above object, a TAB tape according to the present invention comprises: a substrate made of flexible synthetic resin and including mounting portions for mounting thereon semiconductor chips with predetermined intervals; groups of conductive leads formed so as to extend by a predetermined length from those positions in each mounting portion of the substrate, which are confronting with respective points of the semiconductor chip to be electrically connected to an external side; and projections formed at respective portions on a surface of the substrate where no lead group is extracted, and each having a thickness approximately equal to that of the lead of the lead groups. The substrate is made of polyimide. The projection is made of polyimide. Each lead of the lead groups is made of gold. Moreover, the TAB tape further comprises resin leakage preventing means for preventing resin leakage when resin-molding the semiconductor chip, at predetermined positions of the lead groups. The resin leakage preventing means is made of polyimide. The lead groups extend in four directions from each mounting portion on the surface of the substrate for mounting thereon the semiconductor chip. The projections are formed in three of those portions where the four lead groups made up of the lead groups and the substrate are not extracted. Moreover, the substrate further comprises sprocket holes on the both sides thereof.

Further, in order to attain the above object, a TAB tape according to the present invention comprises: a substrate made of flexible polyimide resin and including mounting portions for mounting thereon semiconductor chips with predetermined intervals, the substrate further including sprocket holes on the both sides thereof; groups of conductive leads formed so as to extend by a predetermined length from those positions in each mounting portion of the substrate, which are confronting with respective points of the semiconductor chips to be electrically connected to an external side and made of gold as its main component; and projections made of polyimide and formed in respective positions on a surface of the substrate where no lead group is extracted, so as to have a thickness approximately equal to that of the lead of the lead groups.

Further, in order to attain the above object, according to the present invention, a metallic mold, which is used for resin-molding a semiconductor chip mounted at a predetermined position on a flexible substrate having a plurality of leads formed on a front surface thereof, comprises: an upper metallic mold part to be brought into contact with the front surface of the flexible substrate; and a lower metallic mold part to be brought into contact with a rear surface of the flexible substrate, the lower metallic mold part having stepped portions formed in respective portions, with which the leads are to be brought into contact, in edge portions of its cavity, into which resin is injected, so as to have a height slightly smaller than a thickness of the flexible substrate. Moreover, projections are formed in respective portions of the upper metallic mold part, which are not to be brought into contact with the leads, in edge portions of the cavity, into which the resin is injected, so as to have a height approximately equal to a thickness of the lead.

Furthermore, in order to attain the above object, according to the present invention, a metallic mold, which is used for resin-molding a semiconductor chip mounted at a predetermined position on a flexible substrate having a plurality of leads formed on a surface thereof, comprises: an upper metallic mold part to be brought into contact with the surface of the flexible substrate, the upper metallic mold part having projections formed in respective portions, which are not to be brought into contact with the leads, in edge portions of a cavity, into which resin is injected, so as to have a height approximately equal to a thickness of each of the leads; and a lower metallic mold part to be brought into contact with a rear surface of the flexible substrate.

On the basis of the above construction, the present invention can provide a flexible substrate or a TAB tape to be used for assemblage of a semiconductor chip and a metallic mold to be used for resin-molding a semiconductor chip mounted to the flexible substrate or the TAB tape, while preventing burrs from being produced when performing resin molding.

In the above construction of the metallic mold for resin molding according to the present invention, the stepped portions are formed on the lower metallic mold part at the edge portions of its resin injection cavity which are in contact with the groups of leads. Therefore, when the semiconductor chip, for example, mounted to the TAB tape is resin-molded the stepped portions of the lower metallic mold part are engaged with the edge portions of the tape and the tape partially enters between the leads by the pressure of the upper and lower metallic mold parts, whereby the gap between the adjacent leads can be reduced.

Moreover, in the above construction of the metallic mold for resin molding according to the present invention, the projections are formed on the upper metallic mold part at the edge portions of its resin injection cavity which are not in contact with the groups of leads. Therefore, when the semiconductor chip, for example, mounted to the TAB tape is resin-molded the projections of the upper metallic mold part are in close contact with the tape, at its portions which are in contact with the groups of leads.

In the above constructions of the flexible substrate and the TAB tape according to the present invention, the projections are formed on the surface of the tape at its portions where no lead group is extracted. Therefore, even when the prior art metallic mold is used to perform the resin molding, the surface portions of the tape, where no lead group is extracted, are in close contact with the metallic mold.

As mentioned above, according to the present invention, since the stepped portions are formed on the lower metallic mold part at the edge portions of its resin injection cavity which are in contact with the groups of leads, when the semiconductor chip, for example, mounted to the TAB tape is resin-molded, the stepped portions are engaged with the edges of the tape, and the leads enter into the tape by the pressing pressure of the upper and lower metallic mold parts so that the gaps between the adjacent leads are reduced. Therefore, it is possible to provide a metallic mold for resin molding which is capable of preventing a resin burr from being produced between the adjacent leads.

Moreover, according to the present invention, since the projections are formed the upper metallic mold part at the edge portions of its resin injection cavity which are not in contact with the groups of leads, it is possible to prevent a gap from being produced between the tape and portions of the upper metallic mold part, which are not in contact with the lead groups. Therefore, it is possible to provide a metallic mold for resin molding in which a fin can be produced in the supporting portion when resin-molding the semiconductor chip, for example, mounted to the TAB tape.

Further, according to the present invention, since the projections are formed in the portions which are not in contact with a resin-molding area of the flexible substrate and in which no group of leads are extracted, the portions of the substrate each having no group of leads extracted is in close contact with the metallic mold when the semiconductor chip is resin-molded. Therefore, it is possible to provide a flexible substrate and a TAB tape which are capable of preventing a resin burr from being produced in a portion of the substrate having no group of leads extracted.

DESCRIPTION OF THE PREFERRED EMBODIMENTS

The preferred embodiments of the present invention will hereinafter be described with reference to the accompanying drawings.

Figure 3:
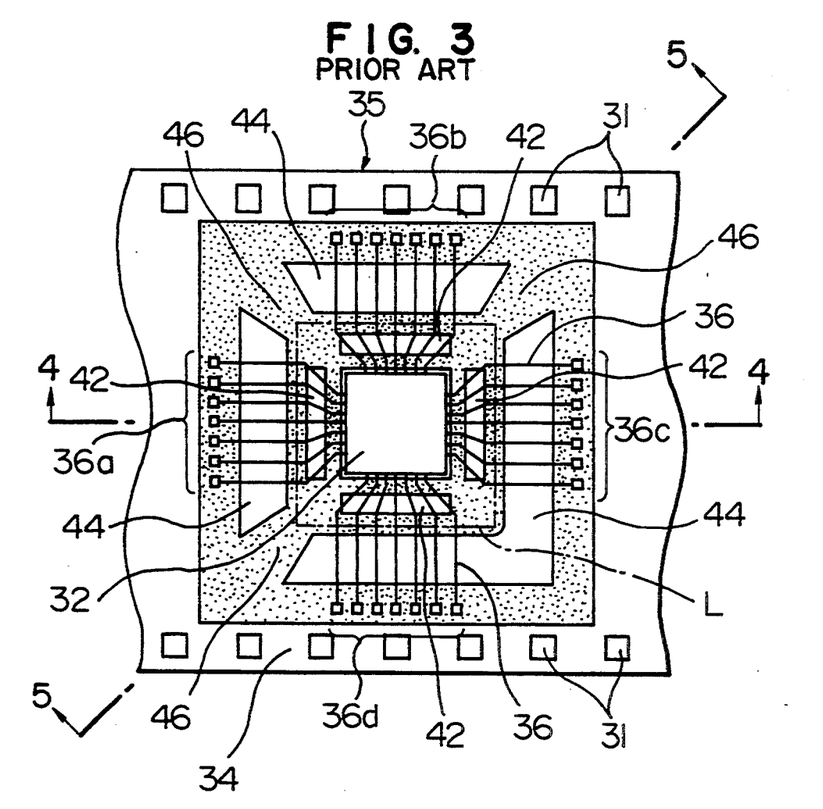
FIG. 3 is a schematic plan view showing the a conventional TAB tape on which a semiconductor chip is mounted by resin molding using the metallic mold of FIGS. 1 and 2.
Figure 4:
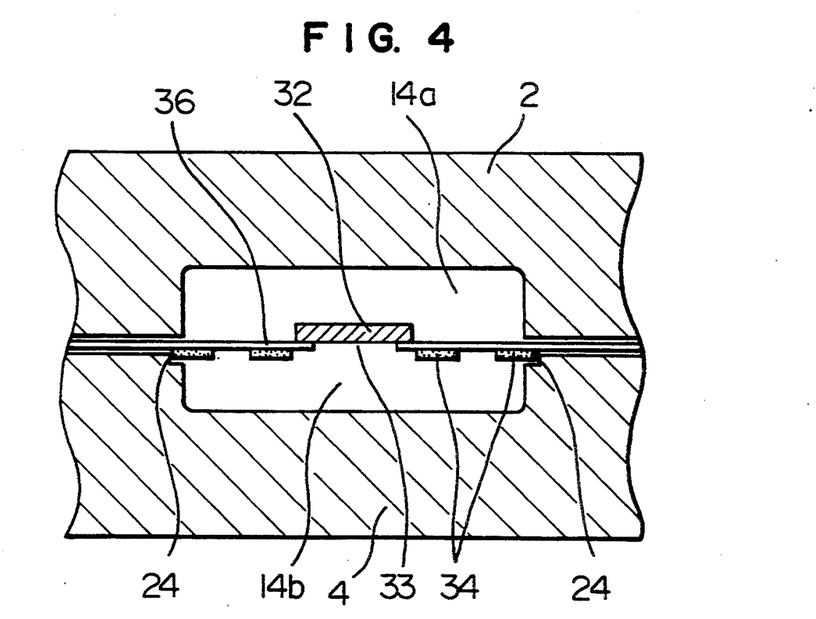
FIG. 4 is a schematic sectional view, taken along the line A—A of FIG. 3, showing a state in which the TAB tape shown in FIG. 3 is held in the metallic mold for resin molding.

A TAB tape shown in FIG. 3 is the same in construction as the prior art TAB tape which is normally used. The TAB tape is made in such a way that leads 36 covered by Au-plating are formed on each frame 35 on a tape-like film (substrate) 34 which is made of an insulating material and has sprocket holes 31 at both edges thereof. The leads 36 are provided only on one surface of the TAB tape (hereinafter, this surface is referred to as "a front surface of the TAB tape"). The central portion of each frame 35 of the film 34 has a device hole 33 used for mounting thereon a semiconductor IC chip 32 as shown in FIG. 4. In the peripheral portion of the hole 33 two kinds of punch holes 42 and 44 are formed as shown in FIG. 3. Moreover, the leads 36 in each frame 35 are divided into four lead groups 36a, 36b, 36c and 36d, which are extracted in four directions that is, upward, downward, right-ward and left-ward in FIG. 3 from the portions confronting with those points of the IC chip 32, which are to be connected to the external side. The thickness of the film 34 is 75 μm and the thickness of each lead 36 is 35 μm. The film 34 is made up of polyimide which provides excellent performance in heat resistance and expansion/contraction resistance.

The punch holes 42 are formed within a resin molding area surrounded by a one-dot chain line L while the punch holes 44 are formed outside the resin molding area. Moreover, the central portion (the portion to be resin-molded) of the TAB tape is supported by three supporting portions 46 which are respectively formed at the top right, top left and bottom left in FIG. 3. When packing the TAB tape, especially packing up the TAB tape with the IC chip 32 being mounted, and carrying it, the supporting portions 46 prevent the leads 36 from vibrating.

Figure 1:
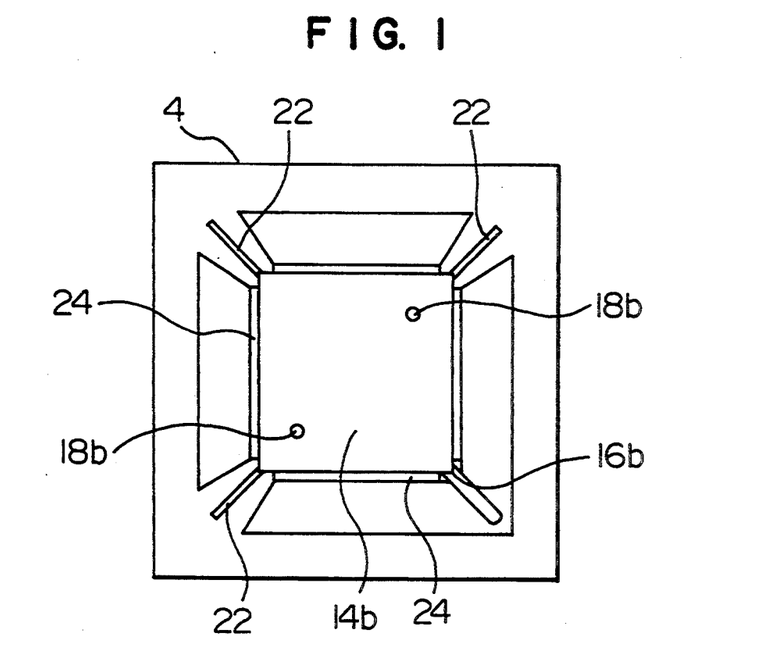
FIG. 1 is a schematic plan view showing the construction of a lower part of a metallic mold for resin molding according to a first embodiment of the present invention.
Figure 2:
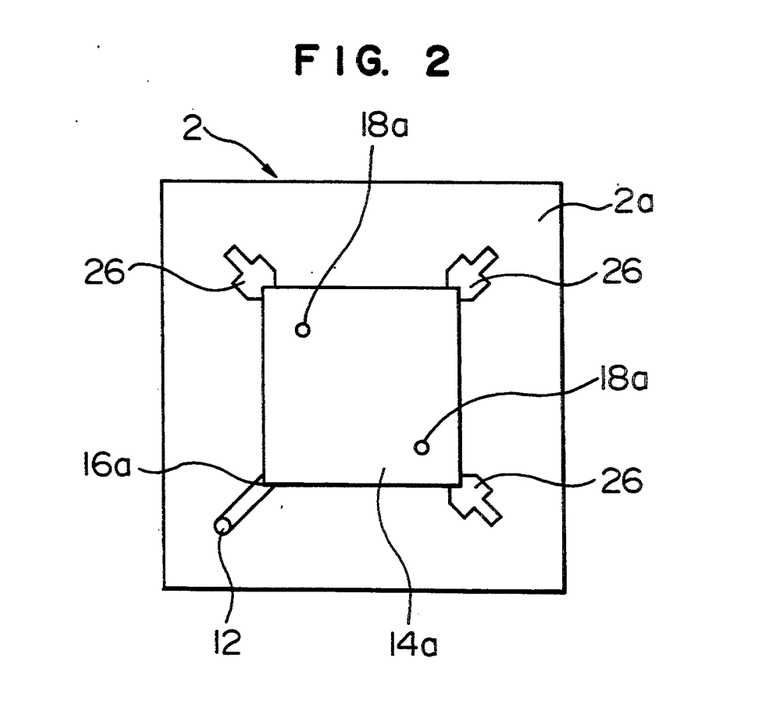
FIG. 2 is a schematic plan view showing the construction of an upper part of the metallic mold for resin molding according to the first embodiment of the present invention.

A metallic mold for resin molding shown in FIG. 1 and FIG. 2 is made up of an upper metallic mold part 2 for pressing the front surface of the TAB tape from the upper side and a lower metallic mold part 4 for pressing the rear surface of the TAB tape. The upper metallic mold part 2 is, as shown in FIG. 2, provided with a pot 12 as a supply port of resin, a cavity 14a as a resin injection space, a gate 16a as an injection port used for injecting therethrough the resin into the cavity 14a, and ejector pins 18a used for taking out a resin-molded product from the metallic mold. Further, in an abutting surface 2a of the upper metallic mold part 2 to the TAB tape, projections 26 each having a height (thickness) almost equal to the thickness of each lead 36 are formed adjacent to the three corners except for the corner having the gate 16a formed therein.

As shown in FIG. 1, in the same manner as in the upper metallic mold part 2, the lower metallic mold part 4 is provided with a cavity 14b as a resin injection space, a gate 16b as an injection port used for injecting therethrough the resin into the cavity 14b, and ejection pins 18a. Moreover, in the lower metallic mold part 4, air vents 22 used for discharging air and gases in the cavities 14a and 14b when injecting the resin are formed in the three corners other than a I corner in which the gate 16b of the cavity 14b is formed. The reason for providing only one pot 12 is that if the supply ports were provided in the upper and lower sides, the joint of the resin masses would be produced at a portion where the resins injected from the two directions meet, so that a trace of the joint will be left after the resin molding.

Moreover, in the lower metallic mold part 4 of FIG. 1, stepped portions 24 each having a height slightly smaller than the thickness of the film 34 (e.g., a height which is smaller by the thickness of the lead than the thickness of the film 34) are formed at the edge portions along the cavity 14b, which are in contact with the lead groups 36a through 36d.

Figure 5:
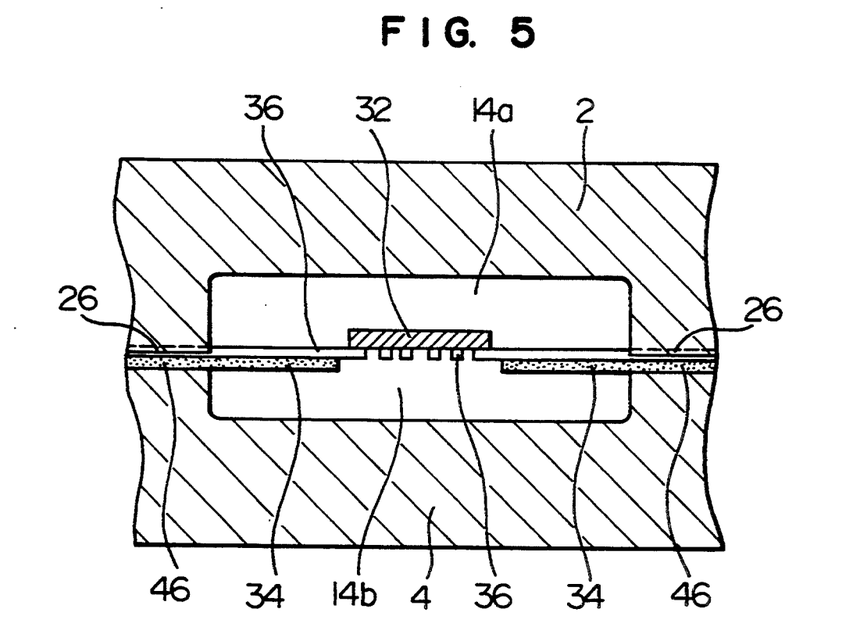
FIG. 5 is a schematic sectional view, taken along the line B—B of FIG. 3, showing a state in which the TAB tape shown in FIG. 3 is held in the metallic mold for resin molding.
Figure 6:
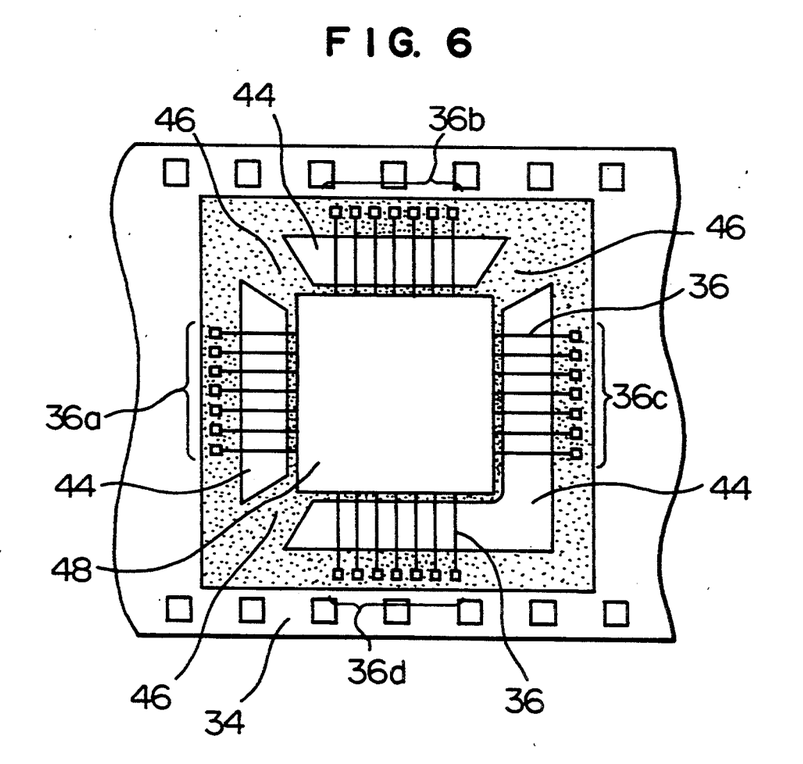
FIG. 6 is a schematic plan view showing the construction of a substrate in which an IC chip as one of semiconductor devices is mounted to the TAB tape shown in FIG. 3 and resin-molded.

Next, the procedure of resin-molding the IC chip 22 will be described. The area of the TAB tape which is to be resin-molded corresponds to a portion surrounded by the one-dot chain line L shown in FIG. 3. The line L is drawn slightly inside the inner edges of the punch holes 44. In the transfer mold method, first, the TAB tape is disposed between the upper metallic mold part 2 and the lower metallic mold part 4 and then is held therebetween. At this time, as shown in FIG. 4, the stepped portions 24 of the lower metallic mold part 4 are engaged with the film 34 at its edges of the punch holes 44. Moreover, as shown in FIG. 5, the projections 26 which are formed in the three corners of the cavity of the upper metallic mold part 2 are in close contact with the supporting portions 46 of the TAB tape. Thus, at a state that the upper metallic mold part 2 and the lower metallic mold part 4 are in close contact with the TAB tape, the melted thermosetting resin is injected from the port 12 into the cavities 14a and 14b through the gates 16a and 16b under pressure. Then, after the melted resin thus injected is solidified by leaving it as it is or heating for several hours, the resin-molded TAB tape is taken out from the metallic mold by pressing the ejector pins 18a and 18b, thereby to complete the resin molding work. FIG. 6 illustrates the construction of the TAB tape thus obtained having a resin molding area 48 where the IC chip 32 is sealed by the thermo-setting resin.

Now, as described above, when the TAB tape is held in the prior art metallic mold for resin molding, there is a possibility that the gap is produced between the adjacent leads in the lead groups 36a, 36b, 36c and 36d due to the thickness of each lead, and therefore, when the melted resin is injected thereinto, part of the resin flows out between the adjacent leads to produce a burr. On the other hand, in the above embodiment, the stepped portions 24 are formed to the lower metallic mold part 4 at the edge portions of the cavity 14b thereof and the film 34 is engaged with the stepped portions 24. As a result, when both the upper and lower metallic mold parts 2 and 4 are pressed against each other the leads are partially burred into the film, the film 34 is generally softer than the leads 36. That is, in the present embodiment, when the IC chip is resin-molded, the film 34 partially enters between the adjacent leads to reduce the gap between the leads so that the resin does not enters between the leads. Accordingly, during the resin molding, it is possible to prevent generation of burrs between the adjacent leads.

Moreover, since. the projections 26 each having a thickness equal to that of the lead are formed on the upper metallic mold part 2, as shown in FIG. 2, at the three corners thereof other than a corner having the gate 16a formed therein, the supporting portions 46 and the upper metallic mold part 2 are in close contact with each other. Therefore, it is possible to prevent generation of resin burrs at the supporting portions 46 of the TAB tape having no lead group being formed therein. Incidentally, the air vents 22 are formed in the three corners of the cavity 14b of the lower metallic mold part 4. However, since each groove is very narrow, no resin enters into such air vent.

Thus, in the above first embodiment, the occurrence of the resin burr can be prevented, in the manner as described above, by performing the resin molding by using the upper metallic mold part 2 and the lower metallic mold part 4. Therefore, when the resin-molded TAB tape is punched, no lead is deformed or cut due to the presence of the resin burs.

Figure 7:
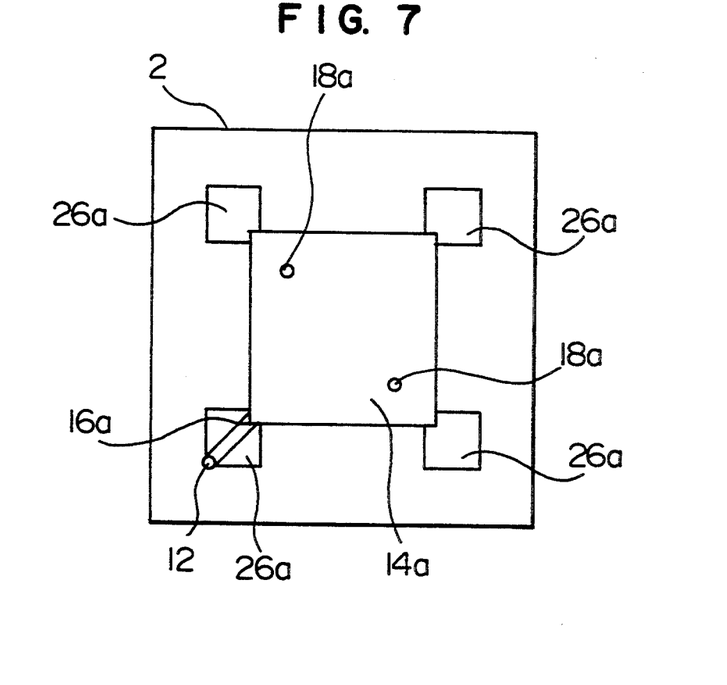
FIG. 7 is a schematic plan view showing the construction of a modification of the upper part of the metallic mold for resin molding.

Incidentally, the first embodiment has been described in which the projections 26 are formed in the three corners of the cavity 14a of the upper metallic mold part 2. However, the present invention is not limited thereto. For example, as shown in FIG. 7, projections 26a may be formed in all of the four corners. But, in the case where the projection is formed in the corner having the gate 16a formed therein, as shown in FIG. 7, the projection is not formed at a portion corresponding to the flow path of the resin. Moreover, so long as the part of the projection 26, which is in contact with the resin molding area, is formed to have the same shape as the part of the supporting portion 46, which is in contact with the resin molding area, the remaining shape of the projection is to not crucial. Accordingly, the shape of the projection is not limited to the shape shown in FIG. 2. That is, it may be formed almost as a square as shown as FIG. 7, or in a strip-like dam.

Figure 8:
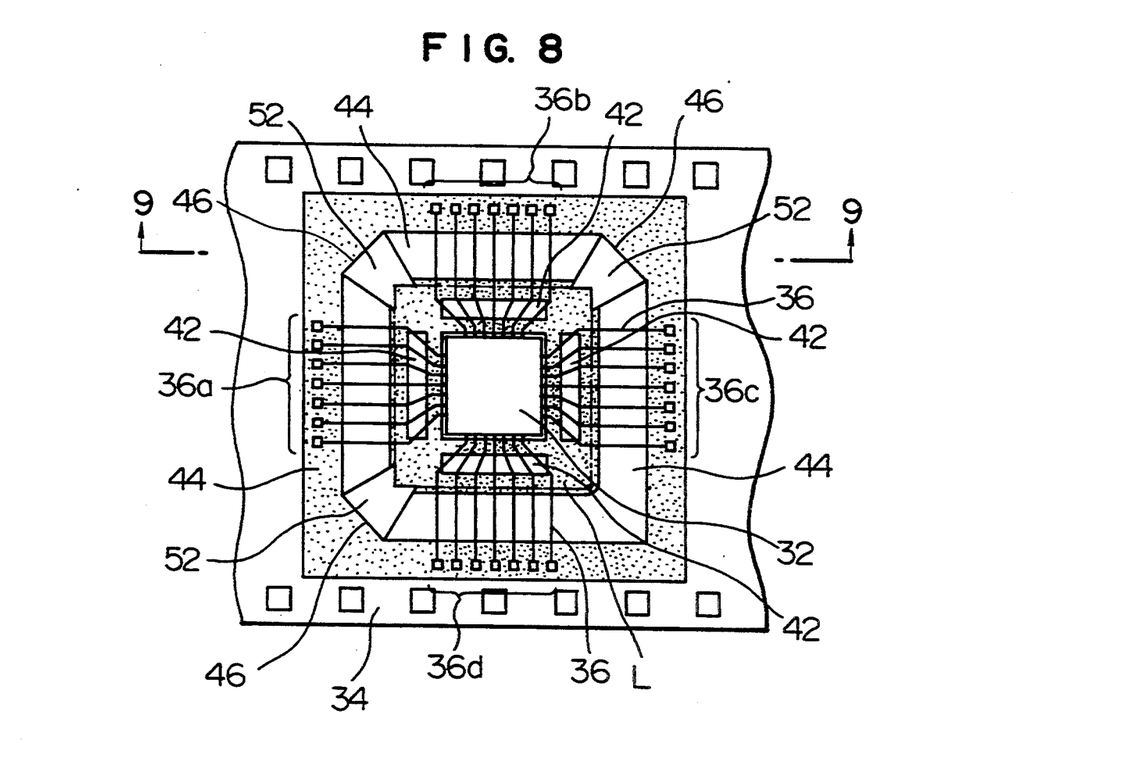
FIG. 8 is a schematic plan view showing the construction of a TAB tape according to the second embodiment of the present invention.
Figure 9:
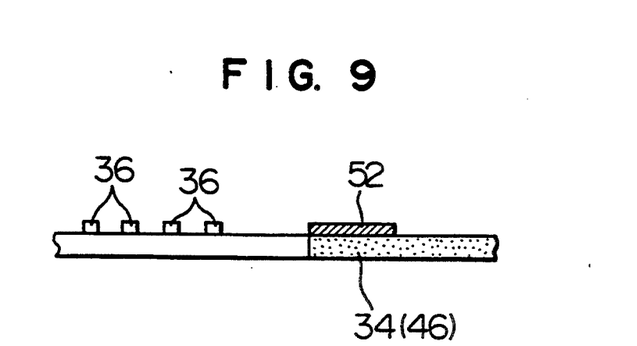
FIG. 9 is a schematic enlarged sectional view, taken along the line C—C of FIG. 8, showing the construction of the TAB tape according to the second embodiment of the present invention.

Next, the second embodiment of the present invention will be described with reference to FIGS. 8 and 9. FIG. 8 is a schematic plan view showing the construction of the TAB tape according to the second embodiment of the present invention. FIG. 9 is a schematic enlarged sectional view, taken along the line C—C of FIG. 8, showing the construction of the TAB tape. In the second embodiment, those parts having the same functions as the parts in the first embodiment of FIG. 1 are represented by the same reference numerals and the detailed description thereof is omitted here for brevity.

The TAB tape (flexible tape) of the second embodiment is different from the TAB tape used in the first embodiment in that as shown in FIGS. 8 and 9, projections 52 each having a height (thickness) approximately equal to the thickness of the lead 36 are formed at areas of the supporting portions 46 on the front surface of the TAB tape as shown in FIG. 3 and outside the resin molding area L. The projection 52 is made of polyimide which is the same as the component of the film 34 and adhered to the position of each supporting portion 46. The remaining construction of the TAB tape is the same as that of the first embodiment. According to the second embodiment, it is possible to further reduce the possibility that when packaging and carrying the resin-molded product with the IC chip 32 being mounted, the defects such as the deformation of the leads 36 and the like are generated.

The metallic mold, which is used when the IC chip is resin-molded by using the TAB tape of the second embodiment, may be a combination of the lower metallic mold part 4 of the first embodiment and the prior art upper metallic mold part 102 in which the abuting surface is formed to be flat. In order to resin-mold the IC chip 32, first, the TAB tape is disposed between the upper metallic mold part 102 and the lower metallic mold part 4 and then held therebetween. At this time, the stepped portions 24 of the lower metallic mold part 4 are engaged with the edges of the film 34 in the same manner as in the first embodiment. Moreover, since the projections 52 are formed on the respective supporting portions 46 of the TAB tape, the corners of the upper metallic mold part 102 are completely in close contact with the projections 52. Thereafter, the resin molding work will be performed in the manner as described in detail in the first embodiment.

According to the TAB tape of the second embodiment, even when the prior art upper metallic mold part 102 is used, since the projections 52 are formed on the respective supporting portions 46 of the film 43, the film 34 and the upper metallic mold part 102 can be brought in close contact with each other even at the supporting portions 46. Accordingly, it is possible to prevent generation of the resin burrs at the supporting portions in the same manner as in the first embodiment.

Figure 10:
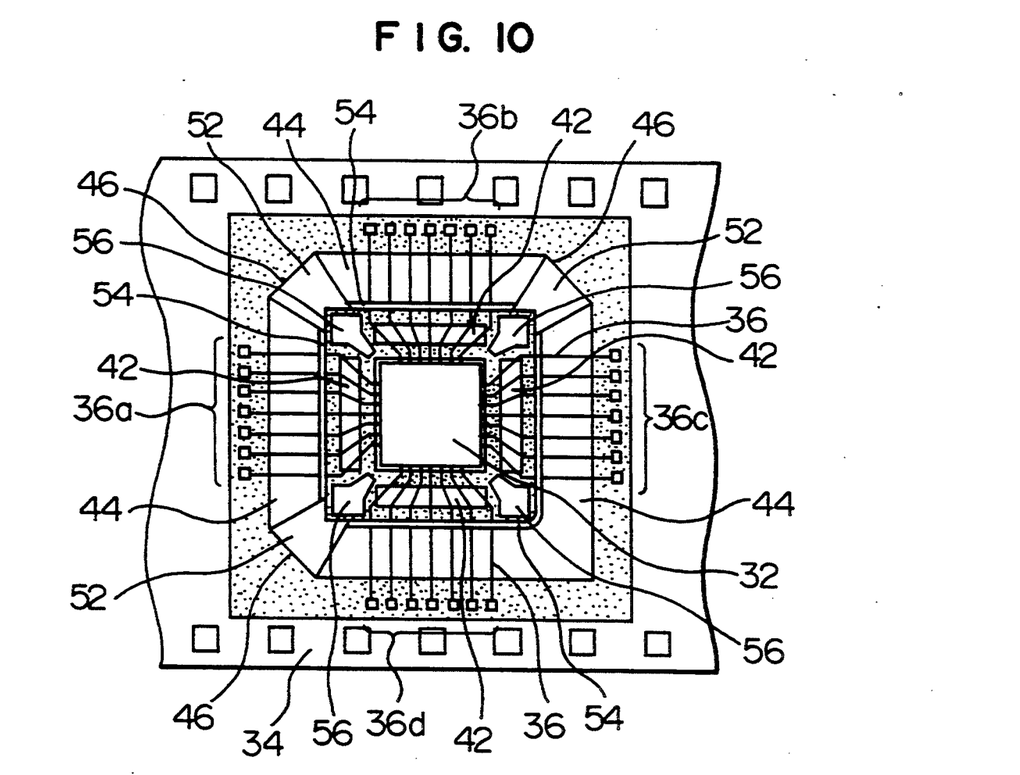
FIG. 10 is a schematic plan view showing the construction of a TAB tape according to the third embodiment of the present invention.

In the above second embodiment, the description has been given to the specific case where the projection 52 is formed at the whole area of the supporting portion 46 as shown in FIG. 3. However, the present invention is not limited thereto. That is, for example, as shown in FIG. 10, the projections 52 may have dams 54 which are formed in a strip-like shape along the resin molding area L. The dam 54 is made of polyimide which is the same material as that of the film 34 or the projection 52. The detailed construction of the dam 54 on the leads 36 is described in U.S. Pat. No. 5,031,022. Moreover, in order to reduce the possibility that during the resin molding, the TAB tape blocks smooth flow of the melted resin from the cavity 14a to the cavity 14b, it will be better to further provide punch holes 56 in the film 34. In FIG. 10, the punch holes 56 are formed in the four film areas each between the lead groups 36. The same effects can be obtained by forming the punch holes 56 in the TAB tape of FIG. 3 or 8 other than the TAB tape of FIG. 10.

Further, although in the above embodiments, the description has been given to the case where the TAB tape is used as the flexible tape, the present invention is not limited thereto. That is, the flexible tape may be another film-like tape having a semiconductor chip mounted thereto.

We claim:

1. A flexible substrate for mounting of a semiconductor chip, comprising:
   a base film unit made of a flexible synthetic resin including a mounting portion, for mounting said semiconductor chip, and a resin molding area, said mounting portion being positioned inside said resin molding area;
   a plurality of conductive leads mounted on said base film unit, each of said conductive leads having an inner lead portion to be connected to a connecting point of said semiconductor chip, and an outer portion extending outside of said resin molding area of said base film unit;
   said plurality of conductive leads being divided into groups of conductive leads spaced apart around said mounting portion; and
   a plurality of projections formed on the surface of said base film unit around said mounting portion only at spaces between adjacent two of said lead groups, each projection having a height substantially equal to that of the leads.

2. A TAB tape comprising:
   a base film unit made of a flexible synthetic resin and including consecutive mounting portions, each for mounting thereon a semiconductor chip having connecting points;
   a plurality of conductive leads provided for each of said mounting portions and mounted on said base film unit, each of said conductive leads having an inner lead portion to be connected to one of said connecting points of said semiconductor chip, and an outer portion;
   said plurality of conductive leads being divided into groups of conductive leads spaced apart around each of said mounting portions; and
   a plurality of projections formed on the surface of said base film unit around each of said mounting portions only at spaces between adjacent two of said lead groups, each projection having a height substantially equal to that of the leads.

3. A TAB tape comprising:
   a base film unit made of a flexible polyimide resin and including consecutive mounting portions, each for mounting thereon a semiconductor chip having connecting points;
   a plurality of resin molding areas in said base film unit, each of said mounting portions being positioned inside one of said resin molding areas;
   a plurality of conductive leads mounted on said base film unit, each of said conductive leads being made of gold as its main component and having an inner lead portion to be connected to a one of said connecting points of said semiconductor chip, and an outer portion extending outside one of said resin molding areas of said base film unit;
   said plurality of conductive leads being divided into groups of conductive leads spaced apart around each of said mounting portions; and
   a plurality of projections made of polyimide resin and formed on the surface of said base film unit around each of said mounting portions only at spaces between adjacent two of said lead groups, each projection having a height substantially equal to that of the leads.

4. A TAB tape for resin-molding a semiconductor chip while sandwiching the semiconductor chip mounted on the TAB tape between an upper mold in contact with one upper surface of the TAB tape and a lower mold in contact with the opposite lower surface of the TAB tape, comprising:
   a base film unit made of a flexible synthetic resin and including consecutive mounting portions, each for mounting thereon said semiconductor chip having connecting points;
   a plurality of conductive leads mounted on said base film unit, each of said conductive leads having an inner lead portion to be connected to one of said connecting points of said respective semiconductor chip, and an outer portion;
   said plurality of conductive leads being divided into groups of conductive leads spaced apart around each of said mounting portions; and
   a plurality of projections formed on the upper surface of said base film unit and spaced around each of said mounting portions only at spaces between adjacent two of said lead groups and sandwiched between the upper and lower molds, each projection having a height substantially equal to that of the leads.

5. A flexible substrate according to claim 1, wherein said base film unit is made of polyimide.

6. A flexible substrate according to claim 1, wherein each of said projections is made of polyimide.

7. A flexible substrate according to claim 1, wherein each lead of said lead groups is made of gold.

8. A flexible substrate according to claim 1, wherein the number of said lead groups is four and said four lead groups extend in four directions, respectively, from said mounting portion on the surface of said base film unit.

9. A flexible substrate according to claim 8, wherein said projections are formed at three of four areas disposed between every adjacent two of said four lead groups on said base film unit.

10. A flexible substrate according to claim 9, wherein said flexible substrate comprises a plurality of base film units consecutively formed into a shape of an elongated tape with intervals between said units.

11. A flexible substrate according to claim 10, wherein said elongate tape is provided with sprockets holes on both sides thereof.

12. A TAB tape according to claim 2, wherein said substrate is made of polyimide.

13. A TAB tape according to claim 2, wherein each of said projections is made of polyimide.

14. A TAB tape according to claim 2, wherein each lead of said lead groups is made of gold.

15. A TAB tape according to claim 2, wherein the number of said lead groups provided for each of said mounting portions is four and said four lead groups extend in four directions, respectively, from the associated mounting portion on the surface of said base film.

16. A TAB tape according to claim 15, wherein, said projections are formed, respectively, at three of four areas disposed between every adjacent two of said four lead groups on said base film.

17. A TAB tape according to claim 2, wherein said base film further comprises sprocket holes on both sides thereof.

18. A TAB tape according to claim 4, wherein said base film is made of polyimide.

19. A TAB tape according to claim 4, wherein each of said projections is made of polyimide.

20. A TAB tape according to claim 4, wherein each lead of said lead groups is made of gold.

21. A TAB tape according to claim 4, wherein the number of said lead groups provided for each of said mounting portions is four and said four lead groups extend in four directions, respectively, from the associated mounting portion on the upper surface of said base film.

22. A TAB tape according to claim 21, wherein said projections are formed, respectively, at three of four areas disposed between every adjacent two of said four lead groups on the upper surface of said base film.

23. A TAB tape according to claim 4, wherein said base film further comprises sprockets holes on both sides thereof.

* * * * *